(12) United States Patent
Morimoto et al.

(10) Patent No.: US 7,427,717 B2
(45) Date of Patent: Sep. 23, 2008

(54) FLEXIBLE PRINTED WIRING BOARD AND MANUFACTURING METHOD THEREOF

(75) Inventors: Shinji Morimoto, Onojyo (JP); Koji Nakashima, Onga-gun (JP); Toyokazu Yoshino, Fukuoka (JP); Katsuya Okamoto, Kasuga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 387 days.

(21) Appl. No.: 11/131,341

(22) Filed: May 18, 2005

(65) Prior Publication Data

US 2005/0257952 A1 Nov. 24, 2005

(30) Foreign Application Priority Data

May 19, 2004 (JP) ............................ P2004-148680
May 19, 2004 (JP) ............................ P2004-148681
May 19, 2004 (JP) ............................ P2004-148682

(51) Int. Cl.
*H05K 1/00* (2006.01)

(52) U.S. Cl. ...................................... 174/254; 361/748

(58) Field of Classification Search ................. 174/254; 361/748–751
See application file for complete search history.

(56) References Cited

U.S. PATENT DOCUMENTS

2002/0009578 A1*  1/2002  Watanabe et al. ............ 428/209
2003/0151902 A1*  8/2003  Kageyama et al. .......... 361/749

FOREIGN PATENT DOCUMENTS

JP              104256          1/1998

\* cited by examiner

*Primary Examiner*—Jeremy C Norris
(74) *Attorney, Agent, or Firm*—Dickinson Wright, PLLC

(57) ABSTRACT

A flexible printed wiring board has a configuration which is equipped with a solder resist portion formed by coating through the use of a screen printing method on a region including a component mounting portion of a conductor pattern, and a cover lay film pasted in such a manner that an outer circumference portion of an opening portion overlaps an upper portion of a circumference portion of the solder resist portion. A manufacturing method of a flexible printed wiring board of the invention has a configuration which is equipped with a conductor pattern forming process, a solder resist forming process, and a cover lay film pasting process.

7 Claims, 11 Drawing Sheets

FIG. 10A
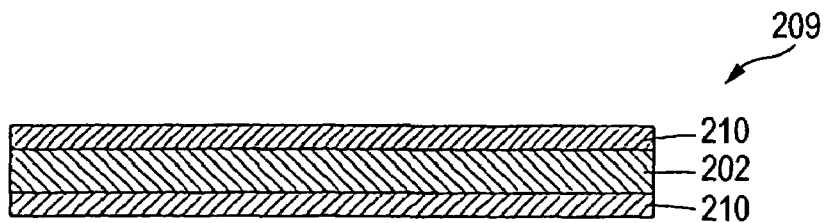
FIG. 10B
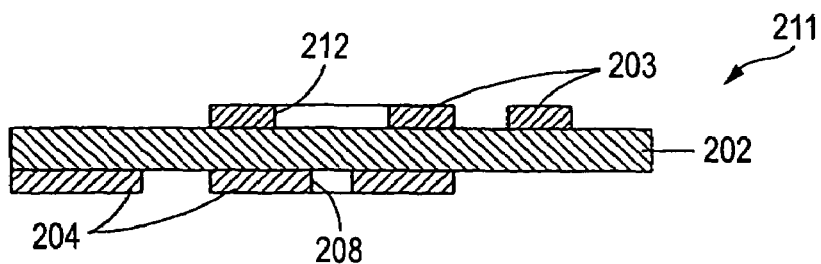
FIG. 10C
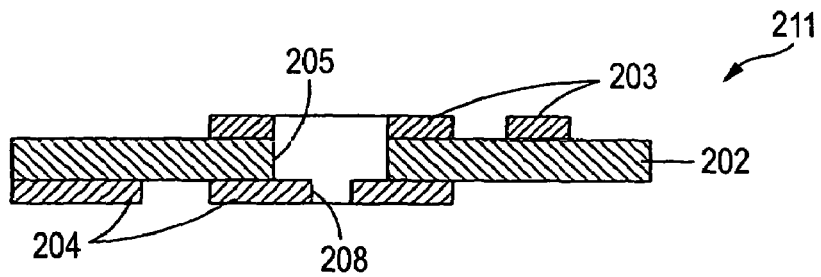
FIG. 10D
FIG. 10E
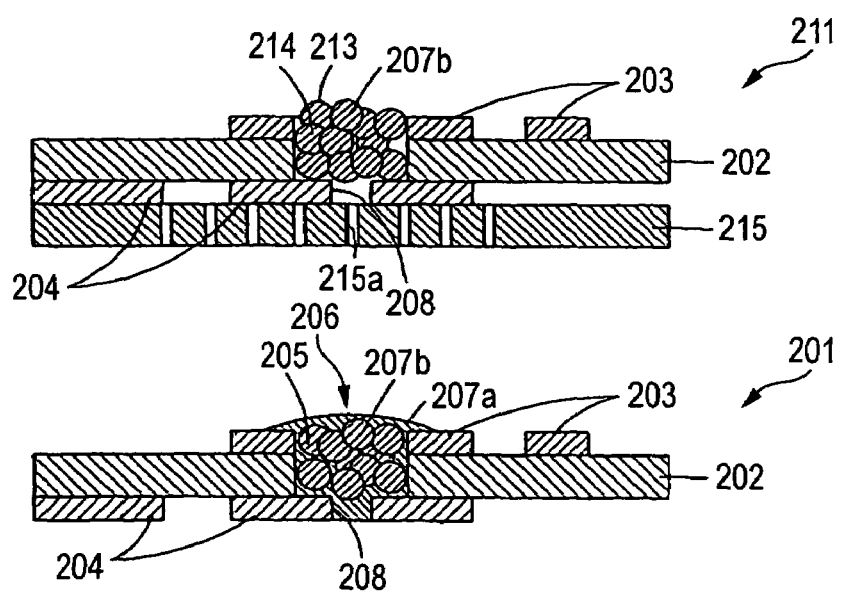

FLEXIBLE PRINTED WIRING BOARD AND MANUFACTURING METHOD THEREOF

This application is based on Japanese Patent Applications No. 2004-148680, 2004-148681 and 2004-148682, which are incorporated herein by reference.

BACKGROUND OF THE INVENTION

1. Field of the Invention

This invention relates to a flexible printed wiring board on which various surface mounting type electronic components are mounted, and which is built into an electronic device such as a mobile phone and an optical disc drive, and a manufacturing method thereof.

2. Description of the Related Art

In recent years, as a component which configures wiring of electronic circuits in various electronic devices, a flexible printed wiring board having flexibility has been used. As a manufacturing method of a commonly used flexible printed wiring board, firstly, manufactured is such a copper-clad lamination board for use in a flexible printed wiring board (hereinafter, referred to as FPC copper-clad lamination board) that a copper foil is glued to one surface or both surfaces of a base film which is composed of a polyimide film etc., by use of a bonding material etc., and the copper foil of the FPC copper-clad lamination board is selectively etched, to form a conductor pattern. Next, a surface of the conductor pattern is coated with an insulation protective material having an opening portion for use in component mounting, and thereafter, surface processing such as plating processing and solder paste printing is applied to a surface of the conductor pattern which is exposed from the opening portion for component mounting, and finally, an outer shape forming process is carried out by use of a metal mold etc., to manufacture a flexible printed wiring board with a predetermined shape.

Here, as a method of forming an insulation protective material on a surface of a conductor pattern, two methods are normally used. A first method is a method of pasting an insulative cover layer film by an bonding material, and a second method is a method of pattern-printing cover coat ink by a screen printing method etc.

The first method is of a so-called cover lay type, and it is common to use a polyimide film having an adhesion layer on a surface of a film which becomes a base, and since it excels in endurance, it is used for a flexible printed wiring board which requires flexibility. Meanwhile, a punching process is preliminarily applied to the cover lay film by use of a metal mold etc., to form an opening portion for component mounting, and alignment with a conductor pattern is carried out and then, thermocompression bonding is carried out, and thereby, an insulation protective material is formed on a surface of the conductor pattern.

The second method is of a so-called cover coat type, and is used mainly in tape auto bonding (TAB), and enables manufacturing with roll-to-roll, and excels in productivity. As cover coat ink, heat-hardening ink, which is produced based on epoxy type resin, is typically used, and therefore, it lacks of endurance as compared to the first method in which the cover lay film is used, and it is not adopted so many in a flexible printed wiring board which requires endurance. In addition, cover coat ink, which is produced based on polyimide type modified resin having flexibility as well as heat-resistance, has been developed, but it does not come up to endurance and mechanical strength of the cover lay film, and there is no actual result of adoption in an application which requires endurance.

In the meantime, in the such like flexible printed wiring board, in recent years, in electronic devices such as mobile phones and optical disc drives, high-density mounting, going with endurance against bending and realization of fine wiring, has been demanded. However, in the above-described first method, the component mounting opening portion in the cover lay film having endurance is formed by a punching process through the use of a metal mold, and therefore, if fine opening portions for component mounting, which are concentrated in one location, are formed, dimensional and positional accuracy is not obtained. In addition, a plurality of expensive metal molds become necessary, which is of high cost, and complicated processes become necessary and therefore productivity is lacking. Further, in the above-described second method, sufficient endurance could not be obtained.

Consequently, in order to realize both of endurance against bending and high-density mounting, such a method that a cover lay film is pasted in a portion requiring endurance of a flexible printed wiring board, e.g., a bending portion which is bent at the time of incorporating in an electronic device, and thereafter, photosensitive resist, which is composed of acrylic type resin etc., is formed on a portion where high-density mounting is carried out, e.g., a component mounting portion, and light exposure and development are applied thereto in a predetermined pattern, and thereby, an insulation protective material having opening portions for component mounting is formed, is disclosed, for example, in JP-A-10-4256. In a flexible printed wiring board of JP-A-10-4256, a bending portion is insulation-protected by a paste type cover lay film, and a component mounting portion is insulation-protected by a photosensitive cover lay film, and therefore, it can realize both of endurance and high-density mounting.

However, the above-described related art has problems as follows.

(1) In a related flexible printed wiring board using a cover lay film and photosensitive resist, tremendous man-hours for resist application or coating, light exposure, development and hot curing are necessary, in order to form the photosensitive resist, and productivity is lacking. Particularly, in the flexible printed wiring board of JP-A-10-4256, as a photosensitive cover lay film, one, which is formed in an individuated sheet form, is used and it is pasted by a batch process, and therefore, in a process of pasting a cover lay film and later processes, it is common that each wiring board is processed in an individuated sheet form, and a forming process of photosensitive resist as described above becomes extremely complicated and troublesome cork. Therefore, it has such a problem that productivity is materially lacking.

(2) In addition, in a portion where a paste type cover lay film and photosensitive resist (photosensitive cover lay film) are overlapped, there is such a necessity that the photosensitive resist completely fill a step of the cover lay film and closely overlaps strongly. But when the photosensitive resist is formed from above of the cover lay film, it has such a problem that a filling characteristic of the photosensitive resist is insufficient, and adhesive strength to the cover lay film is not strong, and protection performance of a conductor pattern is lowered and endurance is lacking.

SUMMARY OF THE INVENTION

The invention is one which solves the above-described related problems, and aims to provide a flexible printed wiring board which can realize endurance against bending etc. and a high-density mounting characteristic of components at the same time.

Further, it aims to provide a flexible printed wiring board which has smaller number of manufacturing man-hours and excels in productivity.

In addition, the invention is one which solves the above-described related problems, and aims to provide a manufacturing method of a flexible printed wiring board which can manufacture a flexible printed wiring board which realized endurance against bending etc. and a high-density mounting characteristic of components at the same time, with smaller man-hours and simple processes, and which also enables manufacturing due to roll-to-roll and excels in productivity.

In order to solve the above-described problems, a flexible printed wiring board of the invention is a flexible printed wiring board in which a conductor pattern is formed on one surface or both surfaces of a base film having an insulating characteristic, and comprises a solder resist portion formed in a region including a component mounting portion of the conductor pattern in a predetermined pattern by a screen printing method, and a cover lay film having an opening portion at a predetermined portion and pasted on the conductor pattern in such a manner that an external circumference portion of the opening portion overlaps an upper part of a peripheral portion of the solder resist portion.

According thereto, it is possible to provide a flexible printed wiring board which can realize endurance against bending etc. and a high-density mounting characteristic of components.

Incidentally, a manufacturing method of a flexible printed wiring board comprises a conductor pattern forming process of forming a conductor pattern on at least one surface of an insulative base film, a solder resist forming process of then, forming a solder resist portion of a predetermined pattern, in a region including a component mounting portion of the conductor patter, by a screen printing method, and a cover lay film pasting process of then, pasting a cover lay film having an opening portion at a predetermined portion, on the conductor pattern, in such a manner that an external circumference portion of the opening portion overlaps an upper portion of a peripheral portion of the solder resist portion.

According thereto, it is possible to provide a manufacturing method of a flexible printed wiring board which can manufacture a flexible printed wiring board which realized endurance against bending etc. and a high-density mounting characteristic of components at the same time, with smaller man-hours and simple processes, and which also enables manufacturing due to roll-to-roll and excels in productivity.

BRIEF DESCRIPTION OF THE DRAWINGS

FIG. 10A is a relevant portion side cross-sectional view of a double faced copper-clad laminated plate which is used for manufacture of a flexible printed wiring board in the fifth embodiment of the invention, FIG. 10B is a relevant side cross-sectional view which shows a copper foil forming process, FIG. 10C is a relevant portion side cross-sectional view which shows an insulating layer forming process, FIG. 10D is a relevant portion side cross-sectional view which shows a composite paste filling process, and FIG. 10E is a relevant portion side cross-sectional view which shows a solder melting process.

DETAILED DESCRIPTION OF PREFERRED EMBODIMENTS

Hereinafter, embodiments of the invention will be described by use of FIGS. 1 through 11E.

First Embodiment

Hereinafter, embodiments of the invention will be described on the basis of each figure.

Figure 1:
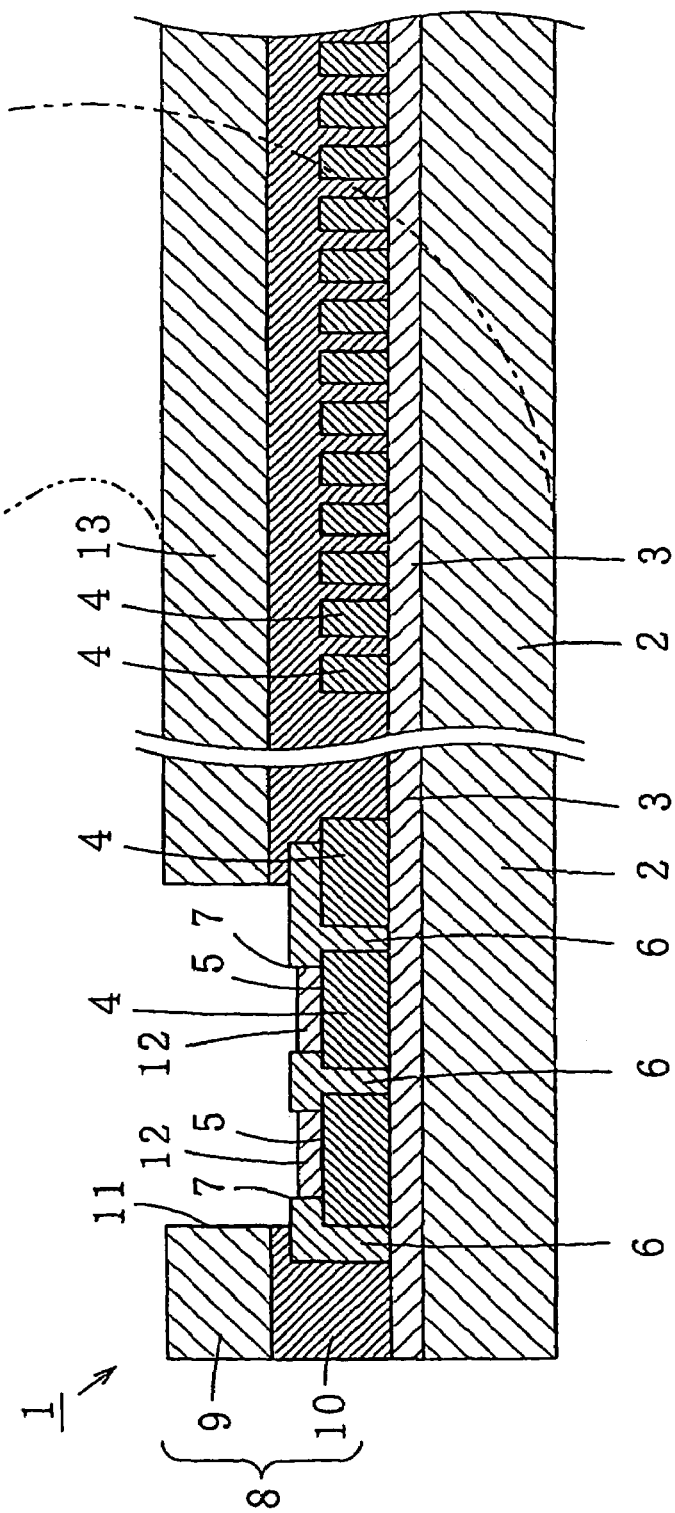
FIG. 1 is a relevant portion side cross-sectional end view of a flexible printed wiring board in a first embodiment of the invention.
Figure 2:
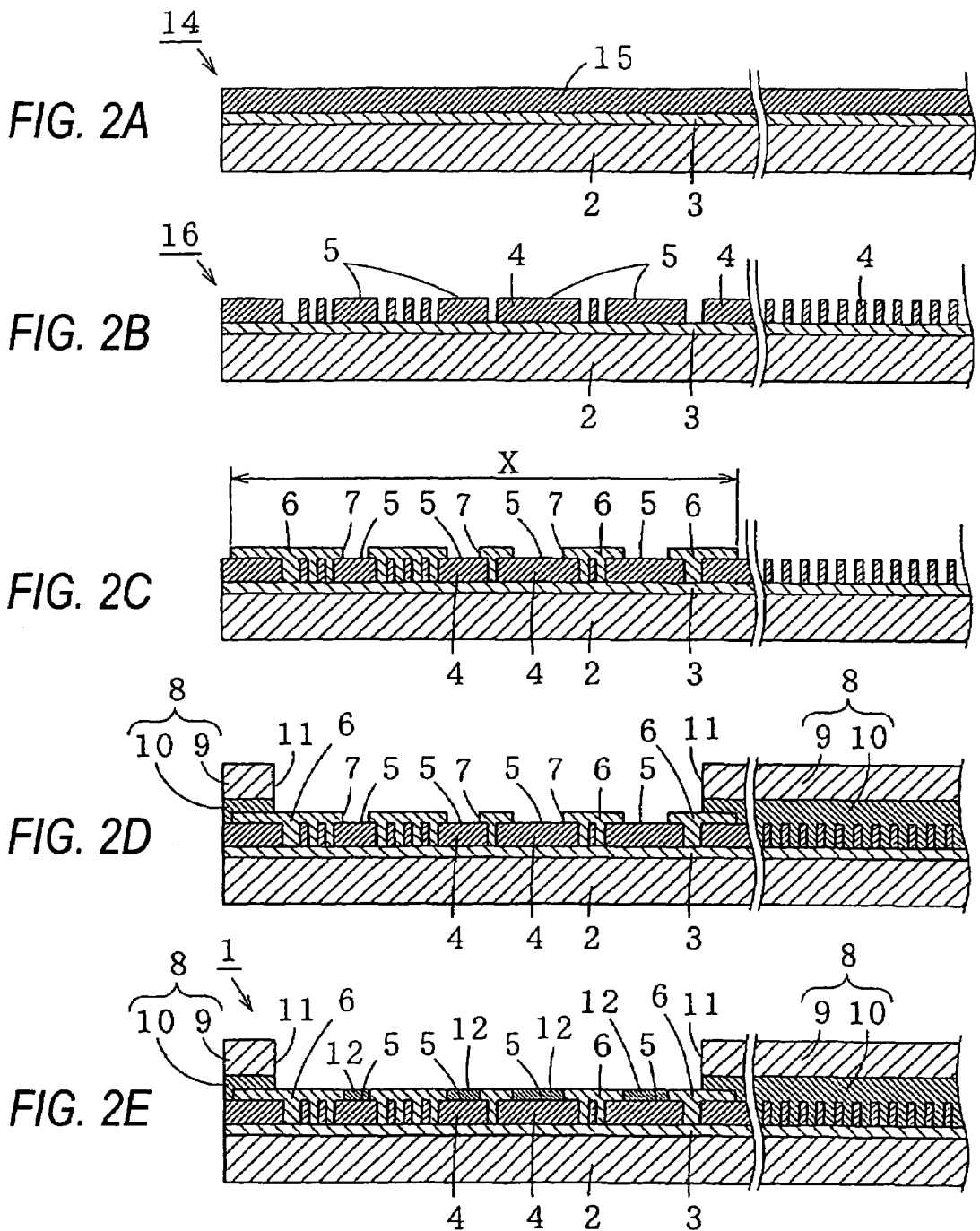
FIG. 2A is a relevant portion side cross-sectional end view or a single faced laminated plate.
FIG. 2B is a relevant portion side cross-sectional end view which shows a conductor pattern forming process.
FIG. 2C is a relevant portion side cross-sectional end view which shows a solder resist forming process.
FIG. 2D is a relevant portion side cross-sectional end view which shows a cover lay film pasting process.
FIG. 2E is a relevant portion side cross-sectional end view which shows a surface treatment process.

FIG. 1 is a relevant portion side cross-sectional end view of a flexible printed wiring board in a first embodiment of the invention.

In FIG. 1, 1 designates a flexible printed wiring board in this embodiment, and 2 designates a base film which is composed of a polyimide film, and 3 designates a bonding material which is coated on an upper surface of the base film 2, and 4 designates a conductor pattern which is formed by etching a copper foil bonded to the base film by the bonding material 3, and 5 designates a component mounting portion which is formed on an end portion etc. of the conductor pattern, and 6 designates a solder resist portion which is formed by coating on a region including the component mounting portion 5 of the conductor pattern 4, and 7 designates an opening portion for component mounting, which is formed at a position corresponding to the component mounting portion 5 of the solder resist portion 6, and 8 designates a cover lay film which is pasted on the conductor pattern 4, and 9 designates a polyimide film which configures an upper layer of the cover lay film 8, and 10 designates a bonding material which is applied on a lower surface of the polyimide film 9, and 11 designates an opening portion which is formed on a predetermined portion of the cover lay film 8, and 12 designates a plating film (surface treatment portion) which is formed on an exposed portion of a surface of the component mounting portion 5, and 13 designates a bending portion which is bent at the time that the flexible printed wiring board 1 is incorporated in an electronic device.

Here, as the bonding material 3 and the bonding material 10, used are one such as resin of an epoxy type, an acrylic 2, type etc. and one to which flexibility is added by deforming the same, and so on. Meanwhile, it is also possible to use a copper-clad lamination plate with a two layer configuration to which a copper foil is bonded to the base film 2 without using the bonding material 3.

As to the solder resist portion 6, heat-hardening resist ink is printed in a predetermined pattern having the opening portion 7 for component mounting, by use of a screen printing method, and thereafter, heat treatment is applied thereto to harden it, and a portion of the conductor pattern 4 is coated to accomplish insulation protection. Meanwhile, a plating film (surface treatment portion) is formed by surface treatment, on the component mounting portion 5 which is exposed without insulation protection.

The cover lay film 8 is formed in such a manner that the opening portion 11 thereof becomes smaller than the solder resist portion 6, and is positioned in such a manner that an outer circumference portion of the opening portion 11 overlaps an upper portion of a peripheral portion of the solder resist portion 6, and bonded to the conductor pattern 2.

As to the flexible printed wiring board 1 in this embodiment which is configured as above, a manufacturing method thereof will be hereinafter described by use of drawings.

FIG. 2A is a relevant portion side cross-sectional end view of a single faced laminated plate which is used for manufacture of a flexible printed wiring board in the first embodiment of the invention, and FIG. 2B is a relevant portion side cross-sectional end view which shows a conductor pattern forming process, and FIG. 2C is a relevant portion side cross-sectional end view which shows a solder resist forming process, and FIG. 2D is a relevant portion side cross-sectional end view which shows a cover lay film pasting process, and FIG. 2E a relevant portion side cross-sectional end view which shows a surface treatment process.

In FIGS. 2A to 2E, 14 designates a single faced copper-clad lamination plate, and 15 designates a copper foil, and 16 designates a single faced wiring board on which the conductor pattern 4 is formed by etching the copper foil 15 of the single faced copper-clad lamination plate 14.

Firstly, as shown in FIG. 2A, prepared is the single faced copper-clad lamination plate 14 which is formed by bonding the copper-foil 15 on a single surface of the base film 2. As the copper foil 15, it is possible to use an electrolytic copper foil and a rolling copper foil. Meanwhile, in this embodiment, the single faced copper-clad lamination plate 14 is used, but there is no limitation to this. It is possible to form the conductor pattern 4 on both surfaces of the base film 2, by use of a double faced copper-clad lamination plate.

Next, as shown in FIG. 2B, etching resist (not shown in the figure) with a predetermined shape is formed on a surface of the copper foil 15, and etching is carried out by use of etchant of iron chloride solution, copper chloride solution etc., and the etching resist is removed to form the conductor pattern 4 (conductor pattern forming process), and the single faced wiring board 16 is obtained. Meanwhile, on the conductor pattern 4 at its end portion etc., the component mounting portion 5, which will become a land portion finally, is formed by etching.

Next, as shown in FIG. 2C, prepared is a screen plate (not shown in the figure) on which a resist pattern is formed, and alignment of this resist pattern and a region X including the component mounting portion 5 of the single faced wiring board 16 is carried out, and heat-hardening resist ink, which is composed of modified polyimide type resin etc., is printed by use of a screen printing method, and thereafter, heat treatment is applied to harden the same, and the solder resist portion 6 having the opening portion 7 for component mounting is formed by coating on the region X (solder resist forming process). Meanwhile, by this resist pattern, the opening portion 7 for component mounting is formed at a position corresponding to the component mounting portion 5 of the solder resist portion 6.

Next, as shown in FIG. 2D, prepared is the cover lay film 8 having the opening portion 11 which is smaller than the solder resist portion 6, and this cover lay film 8 is positioned in such a manner that the component mounting portion 5 is exposed, and an outer circumference portion of the opening portion 11 overlaps an upper portion of a peripheral portion of the solder resist portion 6, and is pasted on the conductor pattern 4 by the bonding material 10 (cover lay film pasting process). Meanwhile, the cover lay film 8 is pasted on a portion including at least the bending portion 13 which is described in FIG. 1.

Next, as shown in FIG. 2E, surface treatment is applied to an exposed surface of the component mounting portion 5 to form a plating film (surface treatment portion) 12 (surface treatment process), and the flexible printed wiring board 1 is manufactured.

The flexible printed wiring board 1 and a manufacturing method thereof in this embodiment are configured as above, and therefore, have operations as follows.

(1) A region including the component mounting portion 5 is coated with the solder resist portion 6, and a region including the bending portion 13 other than that is coated with the cover lay film 8. Therefore, it is possible to protect the conductor pattern 4 on the base film 2 from external environment and to insulation-protect the same electrically, and it is also possible to realize endurance against bending and a high-density mounting characteristic of components at the same time.

(2) In the cover lay film pasting process, pasting is carried out in such a manner that an outer circumference portion of the opening portion 11 of the cover layer film 8 overlaps an upper portion of a peripheral portion of the solder resist portion 6. Therefore, overlapped portions are attached firmly and strongly, and it is possible to high endurance.

(3) The solder resist portion 6 is formed by a screen printing method. Therefore, even if the solder resist pattern 6 is of a fine pattern, it is possible to form it with high dimensional accuracy, and it is possible to heighten a high-density mounting characteristic of components.

(4) The solder resist forming process is carried out prior to the cover lay film pasting process, and thereby, it is possible to optimize a condition of screen printing in the solder resist forming process.

(5) Positioning of the opening portion 11 in the cover lay film pasting process is all right if it is at such a position that the component mounting portion 5 is exposed, and therefore, even if a position of the opening portion 11 is misaligned in some degree, it is all right if the component mounting portion 5 is not closed up, and high positioning accuracy is not required. Therefore, it excels in a power saving characteristic and is easy to realize automation, and excels in productivity.

(6) A screen printing method is used in the solder resist forming process, and protection of the conductor pattern 4 other than a region including the component mounting portion 5 is carried out by simply pasting a cover lay film, and therefore, it is suitable for manufacture by roll-to-roll, and it is possible to carry out the conductor pattern forming process to the cover lay film pasting process, or up to the surface treatment process as its subsequent process, with the roll-to-roll, and a manufacturing process is simple and it can be automated, and it excels in productivity. In addition, as the solder resist portion 6, it is possible to use modified polyimide type ink, and therefore, in case of comparing to photosensitive resist which is composed of acrylic type resin etc., it is possible to heighten film strength such as heat resistance and flexibility, chemical resistance.

(7) By forming the plating film (surface treatment portion) 12 on the component mounting portion 5 in the surface treatment process, it is possible to improve a solder wetting characteristic at the time of electronic component mounting, and a mounting work of electronic components becomes easy and it is possible to heighten reliability of electric connection.

(8) The cover lay film 8 is pasted on at least the bending portion 13. Therefore, it is possible to improve endurance without breaking the conductor pattern 4 even if the bending portion 13 is bent.

Second through sixth embodiments, which will be hereinafter described, disclose a technology which is available on the occasion of realizing a multilayer flexible printed wiring board which is described in the invention of this application.

Second Embodiment

Figure 3:
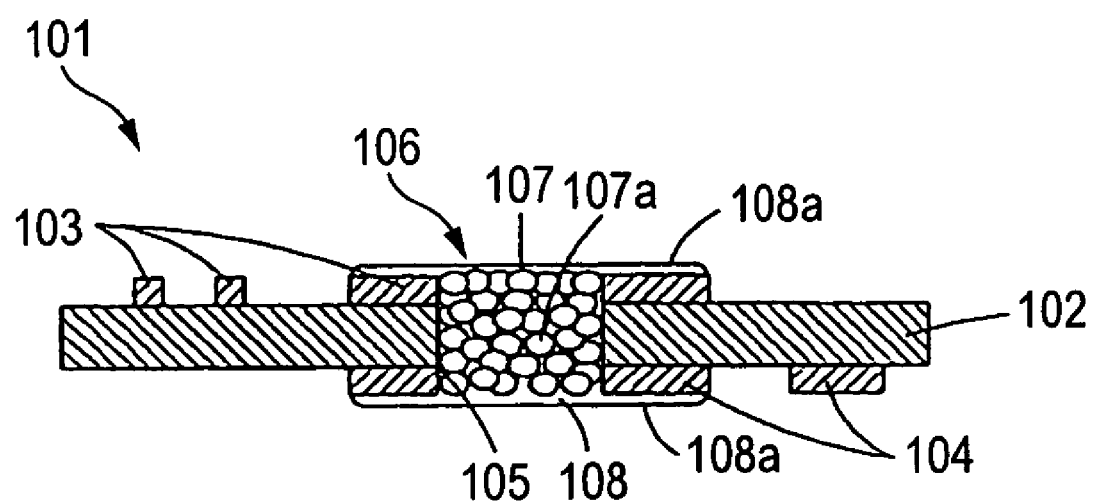
FIG. 3 is a relevant portion side cross-sectional end view of a flexible printed wiring board in a second embodiment of the invention.

FIG. 3 is a relevant portion side cross-sectional end view of a flexible printed wiring board in a second embodiment of the invention.

In FIG. 3, 101 designates a flexible printed wiring board in this embodiment, and 102 designates an insulating layer which is composed of a polyimide film, and 103 designates an upper surface conductive layer on which a predetermined conductor pattern is formed by etching a copper foil pasted on an upper surface of the insulating layer 102, and 104 designates a lower surface conductive layer on which a predetermined conductor pattern is formed by etching a copper foil pasted on a lower surface of the insulating layer 102, and 105 designates a through-hole which is formed so as to penetrate the upper surface conductive layer 103, the insulating layer 102, and the lower surface conductive layer, and 106 designates an interlayer connecting portion which is disposed in an inside of the through-hole 105, and 107 designates a shaped body which is molded in a columnar shape which is roughly the same shape as the through-hole 105 by contacting metal particles 107a with pressure, and 107a designates a metal particle which is composed of copper, nickel, silver, or these alloys and complexes, and 108 designates solder which is permeated and filled in a gap of the shaped body 107, and 108a designates a solder film which is covered on surfaces of the upper surface conductive layer 103 and the lower surface conductive layer 104 at the periphery of the through-hole 105.

As to the flexible printed wiring board 101 in this embodiment which is configured as above, a manufacturing method thereof will be hereinafter described by use of drawings.

Figure 4A:
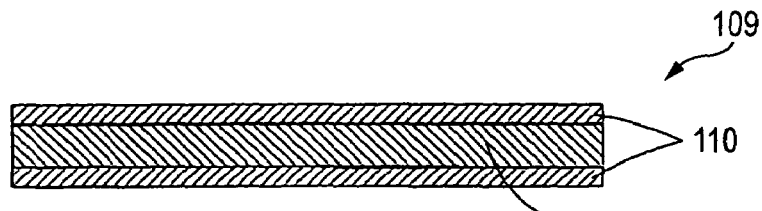
FIG. 4A is a relevant portion side cross-sectional view of a flexible printed wiring board in the second embodiment of the invention.
Figure 4B:
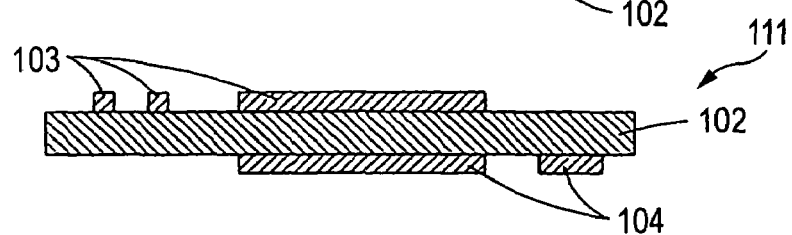
FIG. 4B is a relevant portion side cross-sectional view of a double-sided wiring board on which an electrically conductive layer is formed.
Figure 4C:
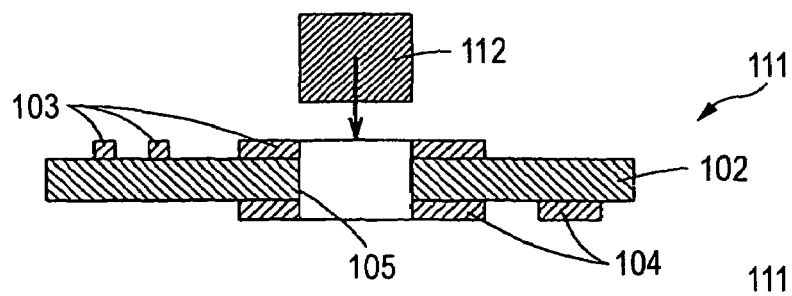
FIG. 4C is a relevant portion side cross-sectional view which shows a through-hole penetrating and forming process.
Figure 4D:
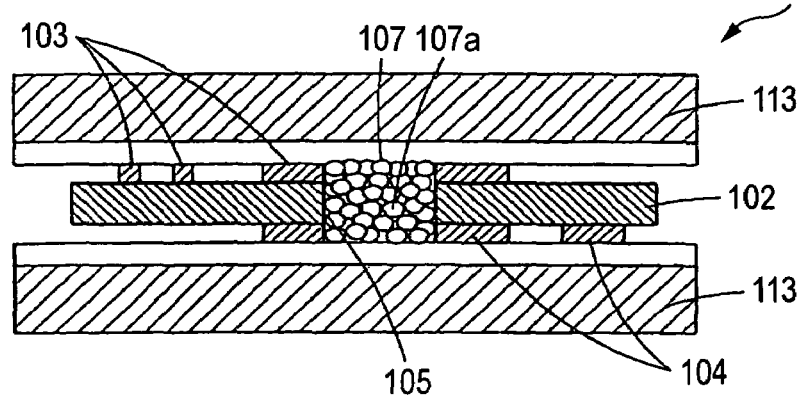
FIG. 4D is a relevant portion side cross-sectional view which shows a pressurized contacting and forming contact forming process.
Figure 4E:
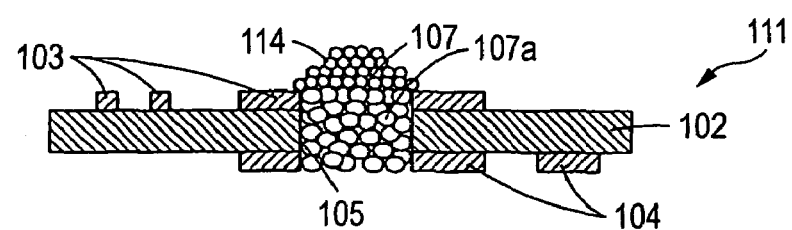
FIG. 4E is a relevant portion side cross-sectional view which shows a solder application process.
Figure 4F:
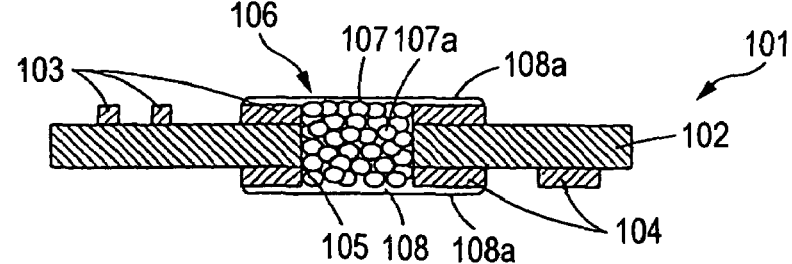
FIG. 4F is a relevant side cross-sectional view which shows a solder permeating and filling process.

FIG. 4A is a relevant portion side cross-sectional view of a flexible printed wiring board in the second embodiment of the invention, and FIG. 4B is a relevant portion side cross-sectional view of a double-sided wiring board on which an electrically conductive layer is formed, and FIG. 4C is a relevant portion side cross-sectional view which shows a through-hole penetrating and forming process, and FIG. 4D is a relevant portion side cross-sectional view which shows a pressurized contacting and forming process, and FIG. 4E is a relevant portion side cross-sectional view which shows a solder application process, and FIG. 4F is a relevant side cross-sectional view which shows a solder permeating and filling process.

In FIGS. 4A to 4F, 109 designates a double faced copper-clad lamination plate, and 110 designates a copper foil, and 111 designates a double faced wiring board on which the upper surface conductive layer 103 and the lower surface conductive layer 104 having predetermined patterns are formed by etching the copper foil 110, and 112 designates a punching metal mold, and 113 designates a pressurization plate, and 114 designates paste form solder.

Firstly, as shown in FIG. 4A, prepared is the double faced copper-clad insulation layer 109 in which the cooper foils 110 are pasted on both surfaces of the insulating layer 102. As the copper foil 110, it is possible to use an electrolytic copper foil and a rolling copper foil. Meanwhile, in this embodiment, used is the double faced copper-clad lamination plate 109 on which the copper foil 110 is bonded, without using the bonding material 103 for the insulating layer 102, but there is no limitation to this. It is possible to bond through a bonding material which is composed of synthetic resin of an epoxy type, an acrylic type etc.

Next, as shown in FIG. 4B, etching resist (not shown in the figure) with a predetermined shape is formed on surfaces of the copper foils 110 at upper and lower sides, and etching is carried out by use of etchant of iron chloride solution, copper chloride solution etc., and the etching resist is removed to obtain the double faced wiring board 111 on which the upper surface conductive layer 103 and the lower surface conductive layer 104 having predetermined patterns are formed.

Next, as shown in FIG. 4C, the through-hole 105 is formed so as to penetrate at a position of electrically connecting the upper surface conductive layer 103 and the lower surface conductive layer 104 of the double faced wiring board 111 by use of the punching metal mold 112 (through-hole penetrating and forming process).

Next, as shown in FIG. 4D, the metal particles 107a are filled in an inside of the through-hole 105 by use of a screen printing method etc., and thereafter, an upper surface side and a lower surface side of the double faced wiring board 111 are sandwiched with pressure by a pair of the pressurizing plates 113 so as to contacting the filled metal particles 107a with pressure, and the columnar shaped body 107, which is the same shape as the through-hole 105, is formed (pressurized contacting and forming process).

Next, as shown in FIG. 4E, a predetermined amount of the paste form solder 114 is applied or an upper portion of the shaped body 107 in an inside of the through-hole 105 by use of a dispenser method etc. (solder application process).

Next, as shown in FIG. 4F, the double faced wiring board 111, on which the past form solder 114 is applied, is heated to temperature of a melting point of the paste form solder 114 or more, to melt the paste form solder 114, and it is permeated into a gap of the shaped body 107 and a gap between the shaped body 107 and the through-hole 105 (solder permeating and filling process). Meanwhile, the permeated paste form solder 114 covers surfaces of the upper surface conductive layer 103 and the lower surface conductive layer 104, to form the solder film 108a. By arbitrarily cooling and hardening the permeated solder 108, the interlayer connecting portion 106 is formed.

Meanwhile, in this embodiment, the metal particle 107a, which is composed of only metal such as copper, is used, but in lieu of this, it is also possible to use such a metal coated particle that a surface of a particle, which is composed of synthetic resin, is coated with metal, or such a thing that metal particles and metal coated particles are mixed. According thereto, as compared to such a case that a particle, which is composed of only metal, is used, it is possible to lower Young's modulus of the interlayer connecting portion 6, and it is possible to prevent occurrence of peel-off etc. of a bond boundary face, by absorbing stress, which is generated by a difference of coefficients of thermal expansion between the interlayer connecting portion 6 and the insulating layer 2, at the interlayer connecting portion 6, and it excels in reliability of electric connection.

In addition, it is also possible to coat a surface of the metal particle 107 in advance with an anti-oxidation film such as a gold plating film and a solder plating film, an anti-rust processed film by synthetic resin, etc. According thereto, it is possible to improve a solder wetting characteristic on a surface of the metal particle, and therefore, the shaped body 107 and the solder 108 are bonded strongly, and it is possible to heighten mechanical strength of the interlayer connecting portion 6. In addition, by applying flux processing by which it is possible to improve the solder wetting characteristic, on a surface of the metal particle 107a, bond strength between the metal particles 107a due to contacting with pressure, and a shape of the shaped body 107 is held stably, and it becomes easy for melted solder to permeate a gap of the shaped body 107.

The flexible printed wiring board 101 and the manufacturing method thereof in this embodiment are configured as above, and therefore, has operations as follows.

(1) A predetermined amount of the metal particles 107a is filled in the through-hole 105, and they are sandwiched with pressure from above and below by the pressurizing plates 11 as it is, and the paste form solder 114 is applied to an upper portion, then, heated, and permeated in a gap of the shaped body 107, and by simply doing so, it is possible to form the interlayer connecting portion 106. Therefore, it is possible to manufacture the flexible printed wiring board 101 with high reliability of electric connection, by simple and smaller processes.

(2) The upper surface conductive layer 103 and the lower surface conductive layer 104 are formed by etching the copper foil 110, and thereafter, the through-hole 105 is formed so as to penetrate, and the interlayer connecting portion 106 is formed in the through-hole 105, and therefore, unlike a related plating through-hole method, it is possible to realize miniaturization of conductor patterns of the conductive layers 103, 104, by formation of the interlayer connecting portion 106, without increasing thickness of the conductive layers 103, 104, and it is possible to grow density of wiring.

(3) The interlayer connecting portion 106, which is formed in the through-hole 105, is formed by such a complex body that the solder 108 is filled in a gap of the shaped body 107 which is formed by contacting the metal particles 107a with pressure. Therefore, a thermal expansion coefficient of the interlayer connecting portion 106 is set up to be almost the same as a thermal expansion coefficient of the insulating layer 102, and thereby, it is possible to prevent peel-off of a bond boundary face due to heating, and it excels in reliability of electric connection.

(4) A most part of the interlayer connecting portion 106 is formed by such the shaped body 107 that the metal particles 107a are contacted with pressure. Therefore, it is possible to heighten mechanical strength of the interlayer connecting portion 106, and it is possible to prevent occurrence of a change in shape, a crack etc., and it excels in reliability of electric connection.

(5) The solder 108 permeates a gap of the shaped body 107, and therefore, it is possible to further heighten mechanical strength of the interlayer connecting portion 106 by the hardened solder 108, and the solder 8 is also filled in a gap between the shaped body 107 and an inner wall of the through-hole 105. Therefore, it is possible to ensure electric connection between the conductive layers 103, 104.

(6) The solder film 108a is formed on surfaces of the upper surface conductive layer 103 and the lower surface conductive film 104 at the periphery of the through-hole 105. Therefore, a bonded area increases, and it is possible to strengthen mechanical strength.

Third Embodiment

Figure 5A:
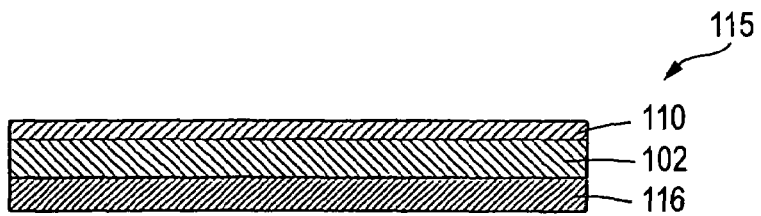
FIG. 5A is a relevant portion side cross-sectional view of a single faced copper-clad lamination board with a bonding material which is used for manufacturing a flexible printed wiring board in a third embodiment of the invention.
Figure 5B:
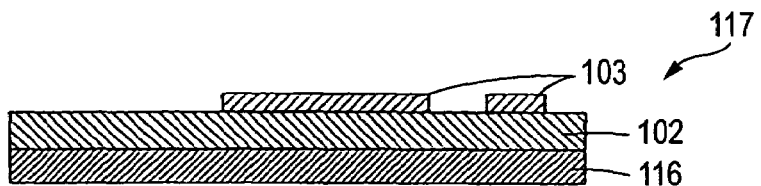
FIG. 5B is a relevant portion side cross-sectional view of a single faced wiring board on which an electrically conductive layer is formed.
Figure 5C:
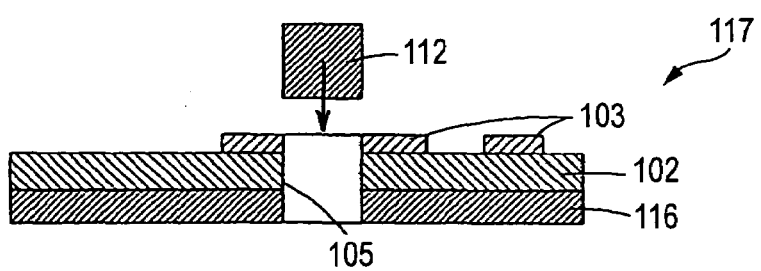
FIG. 5C is a relevant portion side cross-sectional view which shows a through-hole penetrating and forming process.
Figure 5D:
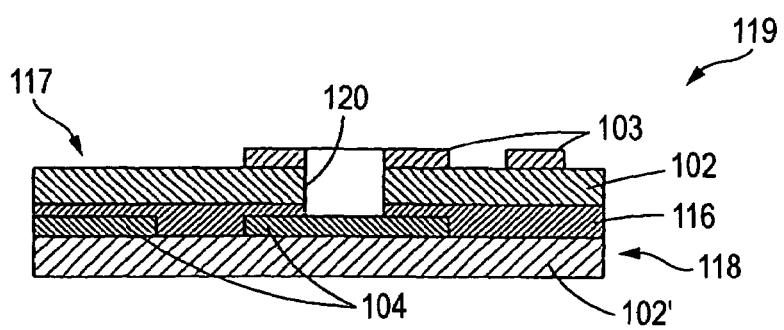
FIG. 5D is a relevant portion side cross-sectional view which shows a pasting process.
Figure 6A:
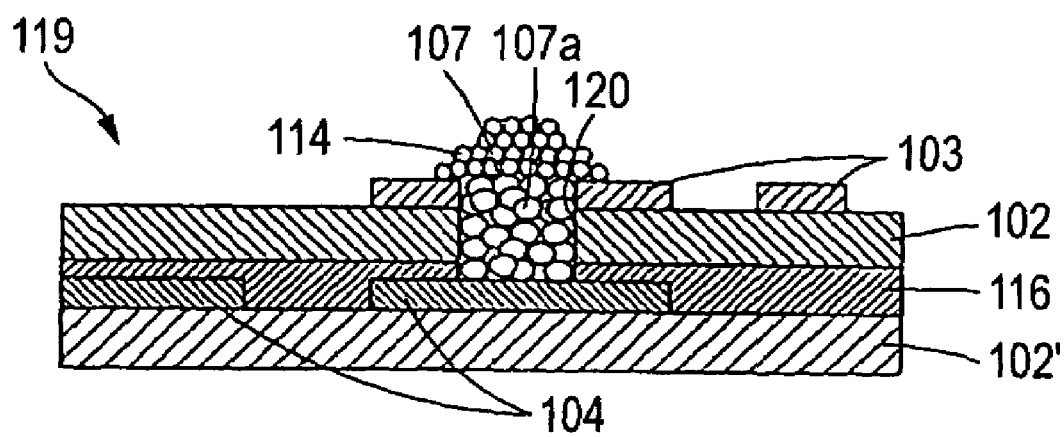
FIG. 6A is a relevant side cross-sectional view which shows a solder application process.
Figure 6B:
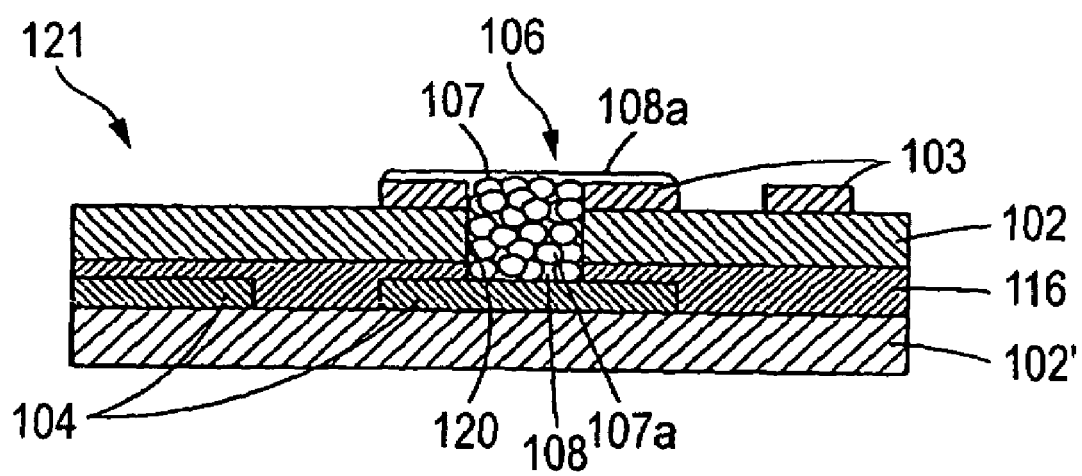
FIG. 6B is a relevant side cross-sectional view which shows a solder permeating and filling process

FIG. 5A is a relevant portion side cross-sectional view of a single faced copper-clad lamination board with a bonding material which is used for manufacturing a flexible printed wiring board in a third embodiment of the invention, and FIG. 5B is a relevant portion side cross-sectional view of a single faced wiring board on which an electrically conductive layer is formed, and FIG. 5C is a relevant portion side cross-sectional view which shows a through-hole penetrating and forming process, and FIG. 5D is a relevant portion side cross-sectional view which shows a pasting process, and FIG. 5F is a relevant side cross-sectional view which shows a pressurized contacting and forming process, and FIG. 6A is a relevant side cross-sectional view which shows a solder application process, and FIG. 6B is a relevant side cross-sectional view which shows a solder permeating and filling process.

In FIGS. 5A to 6B, 115 designates a single faced copper-clad insulation plate on an upper surface of which a copper foil 110 is bonded, and 116 designates an adhesion layer which is formed on a lower surface of the single faced copper-clad insulation plate 115, and 117 designates such a single faced wiring board that a conductive layer having a predetermined conductor pattern is formed by etching the copper foil 110, and 118 designated another single faced wiring board having a conductive layer 104 which is pasted on a lower surface of the single faced wiring board 117, and 119 designates a laminated wiring board which is formed by laminating the single faced wiring board 117 and another single faced wiring board 118, and 120 designated a blind via hole which is formed by closing up a bottom portion of a through-hole 105 which is formed so as to penetrate the single faced wiring board 117, with the use of another single faced wiring board 118, and 121 designates a flexible printed wiring board which is obtained by a manufacturing method in this embodiment. Meanwhile, as to the same things as those described in the second embodiment, explanations thereof will be omitted by giving identical reference numerals and signs thereto.

Firstly, as shown in FIG. 5A, prepared is the single faced copper-clad insulation layer 115 in which the copper foils 110 are pasted on an upper surface of the insulating layer 102 and the adhesion layer 116 is formed on a lower surface, and as shown in FIG. 5B, etching of the copper foil 110 on the upper surface is carried out, to obtain the single faced wiring board 117 on which the conductive layer 103 having a predetermined pattern is formed. Here, generally speaking, as to a conductor pattern of the conductive layer 103 of the single faced wiring board 117, miniaturization is possible as compared to a conductor pattern of a conductive layer of a double faced wiring board. It is because, ordinarily, in forming conductive layers of a double faced wiring board, cooper foils, which exist on both surfaces of a double faced copper-clad insulation plate, are processed to be etched at the same time, and therefore, there is need to apply etchant evenly and uniformly from above and below of the double faced copper-clad insulation plate, but in case that the etchant is pressurized to be sprayed from above and below of the double faced copper-clad insulation plate, there is such a problem that the etchant forms a liquid pool on the upper surface after it is sprayed to the upper surface and etching uniformity is not maintained. Therefore, in case of the double faced wiring board, an etching condition becomes unstable, and it is difficult to form a fine conductor pattern. On one hand, in forming a conductor pattern of a single faced wiring board, only spray from a lower side is enough, and therefore, a liquid pool of etchant can not be formed, and optimization of an etching condition is realized, and it is possible to realize miniaturization of a conductor pattern.

Next, as shown in FIG. 5C, the through-hole 105 is formed so as to penetrate at a position of electrically connecting the conductive layer 103 of the single faced wiring board 117 and the conductive layer 104 which will be described later, by use of the punching metal mold 112 (through-hole penetrating and forming process).

Next, as shown in FIG. 5D, another single faced wiring board 118, in which the conductive layer 104 is formed on an upper surface of the insulating layer 102', is pasted on a lower surface of the single faced wiring-board 117 which the through-hole 105 is formed so as to penetrate, through the adhesion layer 116 (pasting process). According thereto, obtained is the laminated wiring board 119 having the conductive layer 103 on a surface layer of an upper surface and having the conductive layer 104 on an inner layer, and having such the blind via hole 120 that a bottom portion of the through-hole 105 is closed up by another single faced wiring board 118.

Figure 5E:
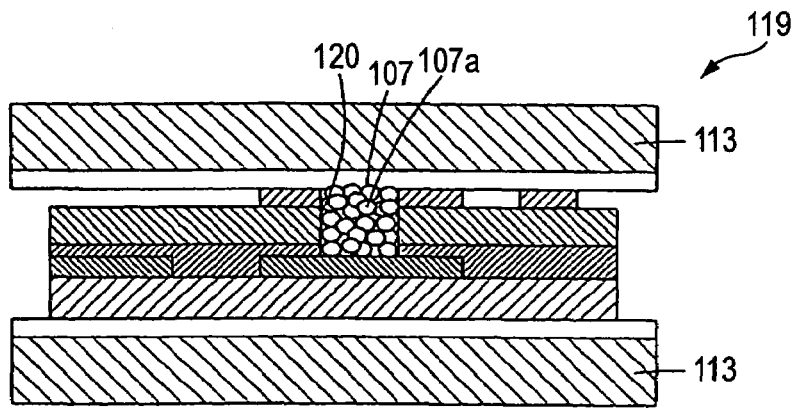
FIG. 5E is a relevant side cross-sectional views which shows a pressurized contacting and forming process.

Next, as shown in FIG. 5E, the metal particles 107a are filled in an inside of the blind via hole 120, by use of a screen printing method, and thereafter, an upper surface side and a lower surface side of the laminated wiring board 119 are sandwiched by a pair of the pressurizing plates 113 to contact the filled metal particles 107a with pressure, to form the columnar shaped body 107 which is of the same shape as the blind via hole 120 (pressurized contacting and forming process).

Next, as shown in FIG. 6A, a predetermined amount of the paste form solder 114 is applied on an upper portion of the shaped body 107 in an inside of the blind via hole 120 by use of a dispenser method etc. (solder application process)

Next, as shown in FIG. 6B, the laminated wiring board 119, on which the past form solder 114 is applied, is heated to temperature of a melting point of the paste form solder 114 or more, to melt the paste form solder 114, and it is permeated into a gap of the shaped body 107 and a gap between the shaped body 107 and the through-hole 105 (solder permeating and filling process). Meanwhile, the melted paste form solder 114 covers surfaces of the conductive layer 103, to form the solder film 108a. By arbitrarily cooling and hardening the permeated solder 108, obtained is the flexible printed wiring board 121 in which the conductive layer 103 on a surface layer and the conductive layer 104 on an inner layer are electrically connected by the interlayer connecting portion 106.

As above, the flexible printed wiring board 121 and the manufacturing method thereof in this embodiment are configured, and therefore, they have operations as follows, in addition to the operations in the second embodiment.

(1) Simply by passing another single faced wiring board 118 on an opposite surface to the conductive layer 103 of the single faced wiring board 117 through the bonding material 116, after the through-hole 105 is formed in the single faced wiring board 117, it is possible to form the blind via hole 120.

(2) As compared to a related plating through-hole method, a bonded area of the conductive layer 104 on an inner layer and the interlayer connecting portion 106 increases, and therefore, it is possible to heighten bond strength, and it excels in reliability of electric connection.

(3) The laminated wiring board 119 is formed by pasting the single faced wiring boards 117, 118 which are capable of realizing miniaturization of conductor patterns of the conductive layers 103, 104, and thereby, it is possible to obtain the flexible printed wiring board 121 on which wiring is formed with high density, simply and with smaller man-hours.

Fourth Embodiment

Figure 7A:
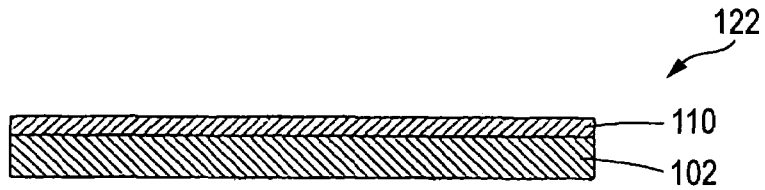
FIG. 7A is a relevant portion side cross-sectional view of a single faced copper-clad lamination board which is used or manufacturing a flexible printed wiring board in a fourth embodiment of the invention.
Figure 7B:
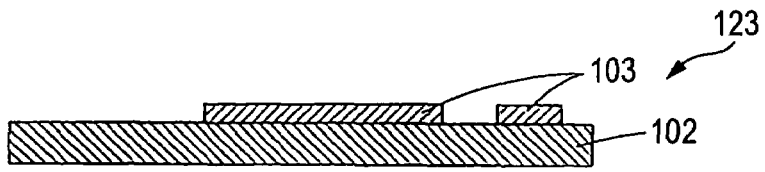
FIG. 7B is a relevant side cross-sectional view of a single faced wiring board on which an electrically conductive layer is formed.
Figure 7C:
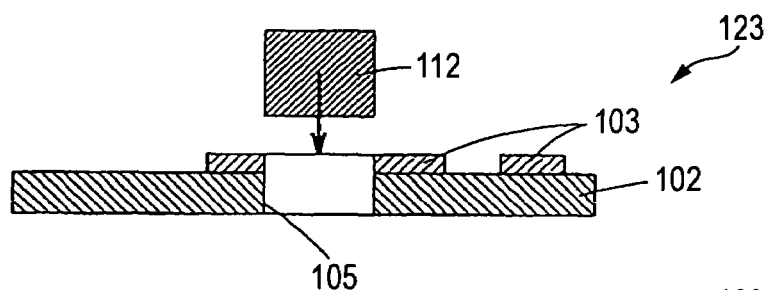
FIG. 7C is a relevant side cross-sectional view which shows a through-hole penetrating and forming process.
Figure 7D:
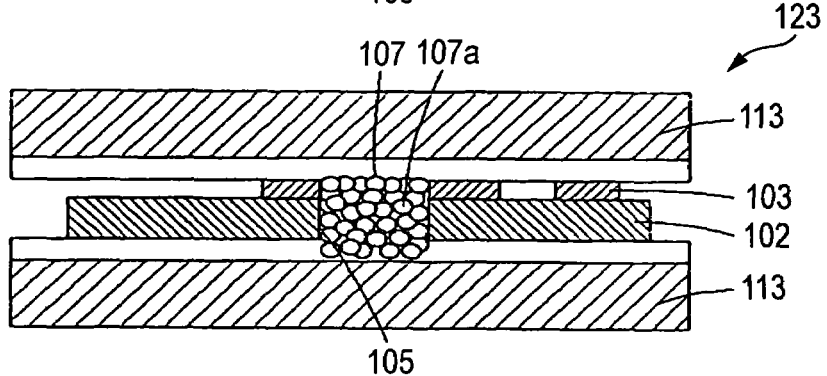
FIG. 7D is a relevant portion side cross-sectional view which shows a pressurized contacting and forming process.
Figure 7E:
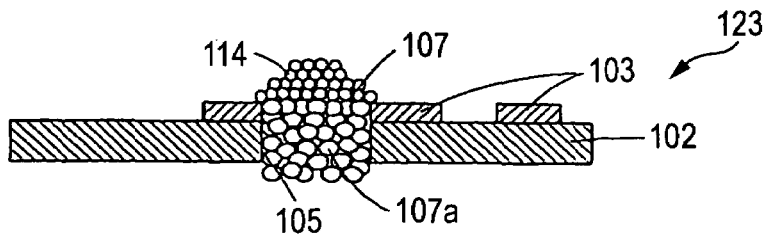
FIG. 7E is a relevant side cross-sectional view which shows a solder application process.
Figure 7F:
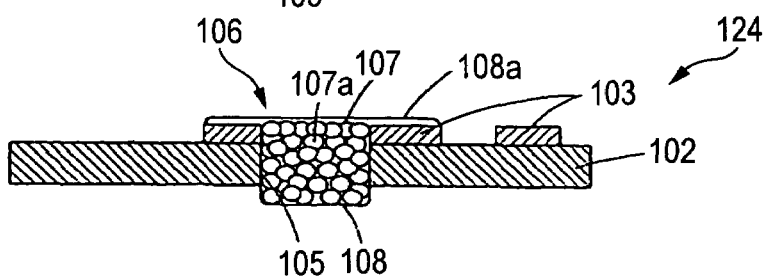
FIG. 7F is a relevant side cross-sectional view which shows a solder permeating and filling process.
Figure 8A:
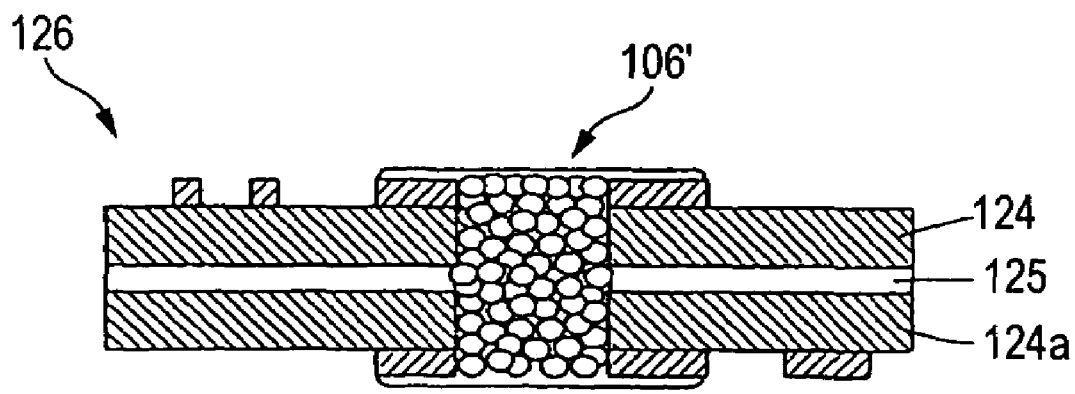
FIG. 8A is a relevant portion side cross-sectional view which shows a laminating process and jointing process.
Figure 8B:
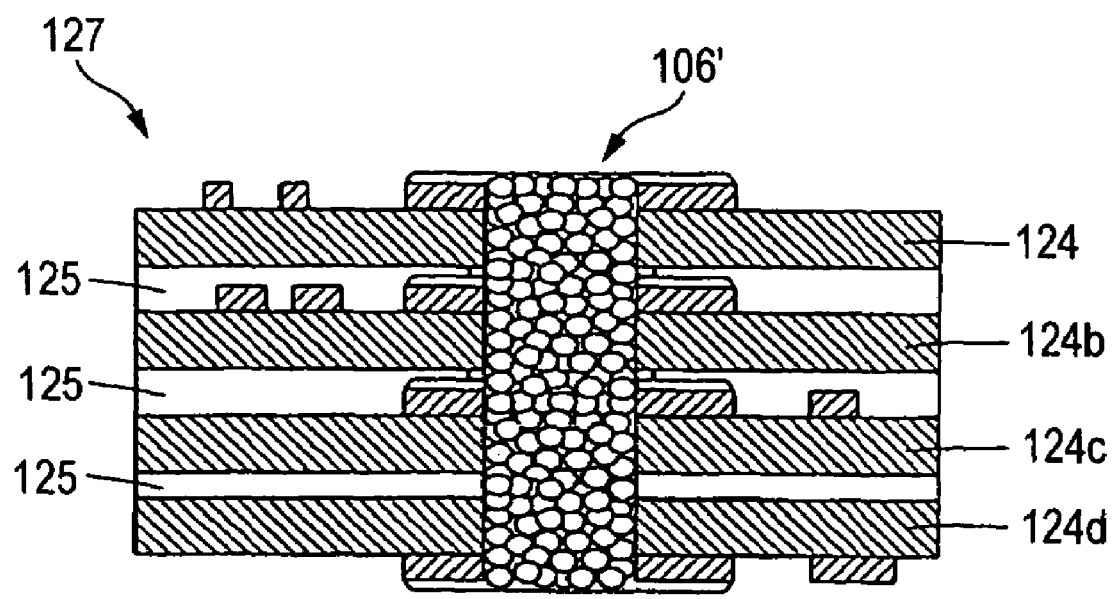
FIG. 8B is a relevant portion side cross-sectional view which shows a multilayer flexible printed wiring board which is manufactured by a manufacturing method of a flexible printed wiring board in the fourth embodiment of the invention.

FIG. 7A is a relevant portion side cross-sectional view of a single faced copper-clad lamination board which is used for manufacturing a flexible printed wiring board in a fourth embodiment of the invention, and FIG. 7B is a relevant side cross-sectional view of a single faced wiring board on which an electrically conductive layer is formed, and FIG. 7C is a relevant side cross-sectional view which shows a through-hole penetrating and forming process, and FIG. 7D is a relevant portion side cross-sectional view which shows a pressurized contacting and forming process, and FIG. 7E is a relevant side cross-sectional view which shows a solder application process, and FIG. 7F is a relevant side cross-sectional view which shows a solder permeating and filling process, and FIG. 8A is a relevant portion side cross-sectional view which shows a laminating process and jointing process, and FIG. 8B is a relevant portion side cross-sectional view which shows a multilayer flexible printed wiring board which is manufactured by a manufacturing method of a flexible printed wiring board in the fourth embodiment of the invention.

In FIGS. 7A to 8B, 122 designates a single faced copper-clad insulation plate on an upper surface of which a copper foil 110 is bonded, and 123 designates a single faced wiring board on which a conductive layer 103 having a predetermined conductive layer is formed by etching the copper foil 110, and 124, 124a, 124b, 124c, 124d designate single faced wiring boards on which interlayer connecting portions are formed, and 125 designates an adhesion layer, and 126 designates a double faced flexible printed wiring board which is formed by bonding the single faced wiring board 124, the single faced wiring board 124a and the adhesion layer 125, and 127 designates a multilayer flexible printed wiring board which is formed by laminating the single faced wiring boards 124, 124b, 124c, 124d through the adhesion layer 125. Meanwhile, as to the same things as those described in the second embodiment, explanations thereof will be omitted □□□□□A□□ identical reference numerals and signs thereto.

Firstly, as shown in FIG. 7A, prepared is the single faced cooper-clad insulation layer 122 in which the copper foils 110 are pasted on one surface of the insulating layer 102, and as shown in FIG. 7B, obtained is the single faced wiring board 123 on which the conductive layer 103 having a predetermined conductive layer is formed by etching a surface of the copper foil 110.

Next, as shown in FIG. 7C, the through-hole 105 is formed at a predetermined position so as to penetrate the conductive layer 103 and the insulating layer 102 of the single faced wiring board 123 by use of the punching metal mold 112 (through-hole penetrating and forming process).

Next, as shown in FIG. 7D, the metal particles 107a are filled in an inside of the through-hole 105, by use of a screen printing method, and thereafter, an upper surface side and a lower surface side of the single faced wiring board 123 are sandwiched by a pair of the pressurizing plates 113 to contact the filled metal particles 107a with pressure, to form the columnar shaped body 107 which is of the same shape as the through-hole 105 (pressurized contacting and forming process). At this time, it is all right if a concave portion (not shown in the figure) is formed in the pressurizing plate 113 at a lower portion side, so as for a lower end portion of the shaped body 107 to be protruded from a lower surface of the insulating layer 102 by only a length of approximately a thickness of the adhesion layer 125 which will be described later.

Next, as shown in FIG. 7E, a predetermined amount of the paste form solder 114 is applied to an upper portion of the shaped body 107 in an inside of the through-hole 105 by use of a dispenser method etc. (solder application process).

Next, as shown in FIG. 7F, the single faced wiring board 123, to which the paste form solder 114 is applied, is heated to temperature of a melting point of the paste form solder 114 or more, to melt the paste form solder 114, and it is permeated into a gap of the shaped body 107 and a gap between the shaped body 107 and the through-hole 105 (solder permeating and filling process). Furthermore, by arbitrarily cooling and hardening the permeated solder, obtained is the single faced printed wiring board 124 in which the interlayer connecting portion 106 is formed.

Next, as shown in FIG. 8A, prepared are the two single faced wiring boards 124, 124a which are manufactured as above, and they are aligned in such a manner that the respective interlayer connecting portions 106 of the respective single faced wiring boards 124, 124a are contacted adjacently, to bond opposite surfaces of respective conductive layers 103 through the adhesion layer 125 (laminating process). Furthermore, the double faced wiring board 126 is reheated to temperature of a melting point of the solder 108, to melt the solder 108 and to bond respective interlayer connecting portions 106 (bonding process). After the bonding process, the solder 108 is arbitrarily cooled and hardened, to obtain the double faced flexible printed wiring board 126 having an interlayer connecting portion 106' which electrically connected conductor layers on a surface layer.

Meanwhile, as shown in FIG. 8B, prepared are the single faced wiring boards 124, 124b, 124c, 124d, in which the interlayer connecting portion 106 is formed, and they are aligned in such a manner that the respective interlayer connecting portions 106 of the respective single faced wiring boards are contacted adjacently, to bond opposite surfaces of respective conductive layers 103 through the adhesion layer 125 (laminating process), and thereafter, the solder 108 is melted by reheat to bond respective interlayer connecting portions 106 (bonding process). According thereto, obtained the multilayer flexible printed wiring board 127 having an interlayer connecting portion 106', in which a plurality of conductive layers of a surface layer and an inner layer are connected electrically.

As above, the flexible printed wiring boards 126, 127 and the manufacturing method thereof in this embodiment are configured, and therefore, they have operations as follows, in addition to the operations in the second embodiment.

(1) By pasting a plurality of the single faced wiring boards 124, 124a, 124b, 124c, 124d on each of which the interlayer connecting portion 106 is formed, it is possible to obtain the double faced flexible printed wiring board 126 having conductive layers on front and rear surfaces, or the multilayer flexible printed wiring board 127 having conductive layer on a surface layer and an inner layer.

(2) The single faced wiring boards 124, 124a, 124b, 124c, 124d, which are capable of realizing miniaturization of a conductor pattern of a conductive layer, are pasted. Therefore, it is possible to obtain a flexible printed wiring board in which wiring is formed with high density, simply and with smaller man-hours.

(3) Simply by melting solder of the respective interlayer connecting portions 106, after the single faced wiring boards 124, 124a, 124b, 124c, 124d are pasted, they are joined and it is possible to realize the interlayer connecting portion 106'. Therefore, it is possible to form the interlayer connecting portion 106' by which conductive layers on a surface layer and an inner layer are electrically corrected only by a simple process.

Fifth Embodiment

Figure 9:
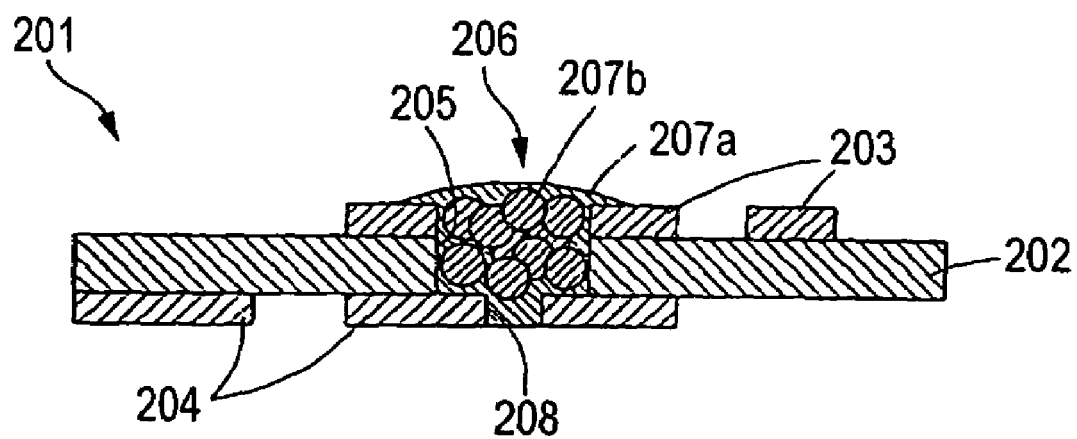
FIG. 9 is a relevant side cross-sectional view of a flexible printed wiring board in a fifth embodiment of the invention.

FIG. 9 is a relevant side cross-sectional view of a flexible printed wiring board in a fifth embodiment of the invention.

In FIG. 9, 201 designates a flexible printed wiring board in this embodiment, and 202 designates an insulating layer which is composed of a polyimide film, and 203 designates an upper surface conductive layer on which a predetermined conductor pattern is formed by etching a copper foil which is pasted to an upper surface of the insulating layer 202, and 204 designates a lower surface conductive layer on which a predetermined conductor pattern is formed by etching a copper foil which is pasted to a lower surface of the insulating layer 202, and 205 designates a hole with bottom, which is formed in the upper surface conductive layer 3 and the insulating layer 202, and 206 designates an interlayer connecting portion which is formed in an inside of the hold with bottom 205 through the use of a complex body of solder 207a and metal particles 207b such as copper, nickel, gold, silver, or these alloys, which is involved in it, and 208 designates a through-hole which is formed in the lower surface conductive layer 204 on a bottom portion of the hole with bottom 205.

As to the flexible printed wiring board 201 in this embodiment which is configured as above, a manufacturing method thereof will be hereinafter described by use of drawings.

FIG. 10A is a relevant portion side cross-sectional view of a double faced copper-clad laminated plate which is used for manufacture of a flexible printed wiring board in the fifth embodiment of the invention, and FIG. 10B is a relevant side cross-sectional view which shows a copper foil forming process, and FIG. 10C is a relevant portion side cross-sectional view which shows an insulating layer forming process, and FIG. 10D is a relevant portion side cross-sectional view which shows a composite paste filling process, and FIG. 10E is a relevant portion side cross-sectional view which shows a solder melting process.

In FIGS. 10A to 10E, 209 designates a double faced copper-clad insulation plate, and 210 designates a copper foil, and 211 designates a double faced wiring board on which an upper surface conductive layer 203 and a lower surface conductive layer 204 having predetermined patterns are formed by etching the copper foil 210, and 212 designates an opening portion which is formed at a land center portion of the upper surface conductive layer 203, and 213 designates composite paste which includes solder particles 214 and metal particles 207b, and 215 designates a suction plate which has a suction hole 215a for sucking the composite paste 213 in an inside of a hole with bottom 205.

Firstly, as shown FIG. 10A, prepared is the double faced copper-clad insulation plate 209 in which the copper foils 210 are pasted to both surfaces of the insulating layer 202. As the copper foil 210, it is possible to use an electrolytic copper foil and a rolling copper foil. Meanwhile, in this embodiment, the double faced copper-clad lamination plate 209, on which the copper foils 210 are bonded on the insulating layer 202 without using a bonding material, is used, but there is no limitation to this. It is also possible to bond with an adhesive through a bonding material which is composed of synthetic resin of an epoxy type and an acrylic type.

Next, as shown in FIG. 10₃, etching resist (not shown in the figure) with a predetermined shape is formed on a surface of the copper foils 210 on upper and lower surfaces, and etching is carried out by use of etchant of iron chloride solution, copper chloride solution etc., and the etching resist is removed to form a predetermined conductor patter, and the opening portion 212 on the copper foil 210 on an upper surface and the through-hole 208 on the copper foil 210 on a lower surface (copper foil forming process), and the double faced wiring board 211, on which the upper surface conductive layer 203 and the lower surface conductive layer 204 are formed, is obtained. Meanwhile, the opening portion 212 and the through-hole 208 are land portions of a conductor pattern, and are formed at corresponding positions on front and rear surfaces of the double faced wiring board 211.

Next, as shown in FIG. 10C, a boring process is applied to the insulating layer 202 which is exposed from the opening portion 212, through the use of a laser such as an excimer laser and a carbon dioxide gas laser, until the lower surface conductive layer 204 is exposed to a bottom portion, to form the hole with bottom 205 (insulating layer forming process). Meanwhile, in the hole with bottom forming process, as a shape of the hole with bottom 20, it is also possible to form in a mortar shape of extending toward the opening portion 212 side.

Next, as shown in FIG. 10D, the suction plate 215 is closely contacted to the lower surface conductive layer 204, and the composite paste 213 is applied by use of a screen printing method etc., over sucking in air in an inside of the hold with bottom 205 through the suction hole 215a and the through-hole 208, and it is sucked and filled in an inside of the hole with bottom 205 (composite paste filling process).

Next, as shown in FIG. 10E, the double faced wiring board 211, in which the composite paste 213 is filled in the hole with bottom 205, is heated to temperature of a melting point of the composite paste 213 or more but lower than a melting point of the metal particles 207b, to melt the solder particles 214 (solder melting process). Meanwhile, the melted solder particles 214 involve the metal particles 207b, and by arbitrarily cooling and hardening them, the interlayer connecting portion 206 is formed.

Meanwhile, in this embodiment, as the composite paste 213, used is one including the solder particles 214 and the metal particles 207b which are composed of only metal such as copper, but in lieu of the metal particles 207b, it is also possible to use synthetic resin particles or carbon fiber powder particles, or such a thing that metal particles and synthetic resin particles are mixed, and so on. According thereto, as compared to such a case that a particle, which is composed of only metal, is used, it is possible to lower Young's modulus of the interlayer connecting portion 206, and it is possible to prevent occurrence of peel-off etc. of a bond boundary face, by absorbing stress which is generated by a difference of coefficients of thermal expansion between the interlayer connecting portion 206 and the insulating layer 202, at the interlayer connecting portion 206, and it excels in reliability of electric connection.

In addition, it is also possible to coat surfaces of the metal particles 207b or synthetic resin particles in advance with an anti-oxidation film such as a gold plating film and a solder plating film, an anti-rust processed film by synthetic resin, etc. According thereto, it is possible to improve a solder wetting characteristic on surfaces of the metal particles 207b and synthetic resin particles, and therefore, the solder 207a and the particles are bonded strongly, and it is possible to heighten mechanical strength of the interlayer connecting portion 206.

In addition, by laminating another single faced wiring board and double faced wiring board, or another flexible printed wiring board 201, on one surface or both surfaces of the fabricated flexible printed wiring board 201, through an adhesion layer. etc., it is also, possible to obtain a multilayer flexible printed wiring board in which wiring is formed with high density.

The flexible printed wiring board 201 and the manufacturing method thereof in this embodiment are configured as above, and therefore, have operations as follows.

(1) Simply by melting the solder particles 214 after the hole with bottom 205 is formed in the double faced wiring board 211, and the composite paste 213 of the solder particles 214 and the metal particles 207b is sucked and filled in the hole with bottom 205, it is possible to form the interlayer connecting portion 206, and therefore, it is possible to manufacture the flexible printed wiring board 201 with high reliability of electric connection, simply and with smaller man-hours.

(2) The interlayer connecting portion 206 is formed in the hole with bottom 205, after the conductive layers 203, 204 are formed by etching the copper foils 210 on both surfaces of the insulating layer 202, and therefore, unlike a related plating through-hole method, it is possible to realize miniaturization of conductor patterns of the conductive layers 203, 204, by formation of the interlayer connecting portion 206, without increasing thickness of the conductive layers 203, 204, and it is possible to grow density of wiring.

(3) It is possible to form the opening portion 212 and the through-hole 208 in the copper foil 210 in addition, on the occasion of forming a conductor pattern by etching, and therefore, another man-hour is not required for forming the opening portion 212 and the through-hole 208, and it is possible to reduce man-hours.

(4) A laser is used for boring of the hole with bottom 205, and therefore, realization of reduction of a hole diameter is possible, and it is possible to form the interlayer connecting portion 206 smaller, and it is possible to respond to realization of high-density of wiring, and after the opening portion 212 and the through-hole 208 are formed in the copper foil 210, a boring process is applied only to the insulating layer 202 by use of a laser, to form the hole with bottom 205. Therefore, it can be formed by a low output laser, and by adjusting an output of a laser, it is possible to apply boring only to the insulating layer 202 with high dimensional accuracy, without the copper foil 210 becoming deformed and the copper foil 210 being penetrated.

(5) The interlayer connecting portion 206 is formed by a complex body of the solder 207a and the metal particles 207b, and therefore, a thermal expansion coefficient of the interlayer connecting portion 206 is set up to be almost the same as a thermal expansion coefficient of the insulating layer 202, and thereby, it is possible to prevent peel-off etc. of a bond boundary face due to heating, and it excels in reliability of electric connection.

(6) The through-hole 208 is formed in a bottom portion of the hole with bottom 205, and therefore, on the occasion of filling the composite paste 213 of the solder particles 214 and the metal particles 207b or synthetic resin particles in the hole with bottom 205, it is possible to discharge air in an inside of the hole with bottom 205, from the through-hole 208, and it is possible to prevent void from occurring in an inside of the interlayer connecting portion 206, and it excels in reliability of electric connection.

(7) In case that the hole with bottom 205 is formed in a mortar shape, it is possible to fill the composite paste 213 in the hole with bottom 205 smoothly and at short times, and it is possible to prevent void from occurring in an inside of the interlayer connecting portion 206, and it excels in reliability of electric connection and productivity.

Sixth Embodiment

Figure 11A:
FIG. 11A is a relevant portion side cross-sectional view of a single faced copper-clad lamination plate which is used for manufacture of a flexible printed wiring board in a sixth embodiment of the invention.
Figure 11B:
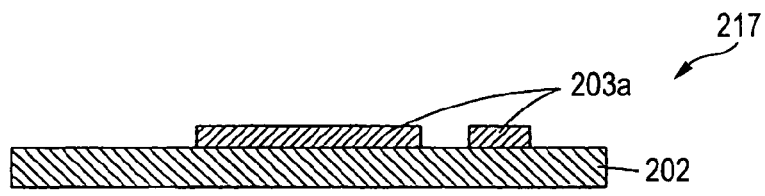
FIG. 11B is a relevant portion side cross-sectional view of a single faced wiring board on which an electrically conductive layer is formed.
Figure 11C:
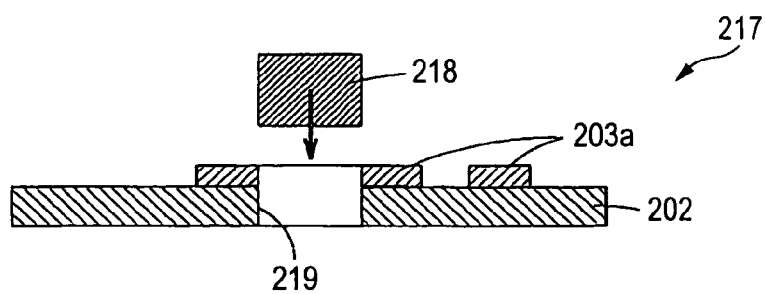
FIG. 11C is a relevant portion side cross-sectional view which shows a penetrating and forming process.
Figure 11D:
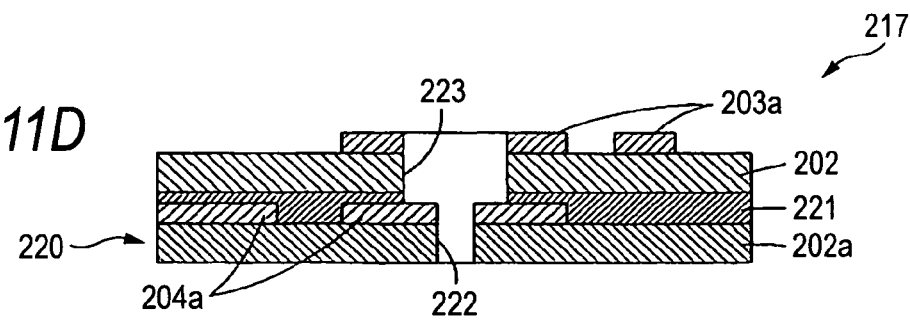
FIG. 11D is a relevant portion side cross-sectional view which shows a pasting process.
Figure 11E:
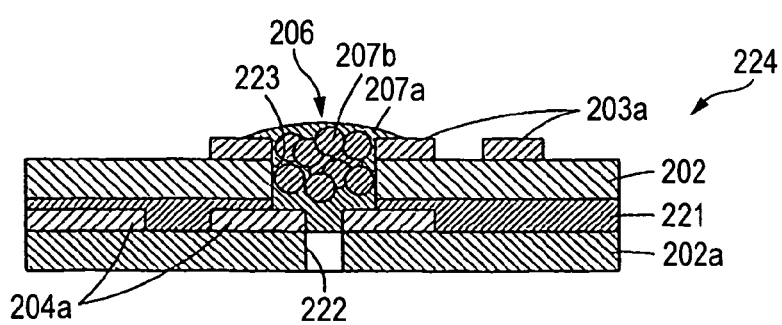
FIG. 11E is a relevant portion side cross-sectional view which shows a composite paste filling process and a solder melting process.

FIG. 11A is a relevant portion side cross-sectional view of a single faced copper-clad lamination plate which is used for manufacture of a flexible printed wiring board in a sixth embodiment of the invention, and FIG. 11B is a relevant portion side cross-sectional view of a single faced wiring board on which an electrically conductive layer is formed, and FIG. 11C is a relevant portion side cross-sectional view which shows a penetrating and forming process, and FIG. 11D is a relevant is portion side cross-sectional view which shows a pasting process, and FIG. 11E is a relevant portion side cross-sectional view which shows a composite paste filling process and a solder melting process.

In FIGS. 11A to 11E, 216 designates such a single faced copper-clad lamination plate that a copper foil 210 is bonded to an upper surface of an insulating layer 202, and 217 designates one single faced wiring board on which a conductive layer 203a having a predetermined conductor pattern is formed by etching the copper foil 210, and 218 designates a punching metal mold, and 219 designates a through-hole for forming a hole with bottom, which is formed in the single faced wiring board 217, and 220 designates another single faced wiring board having a conductive layer 204a on an upper surface of an insulating layer 202a, and 221 designates an adhesion layer for laminating and pasting one single faced wiring board 217 and another single faced wiring board 220, and 222 designates a through-hole which is formed in another single faced wiring board 220, and 223 designates a hole with bottom, which is formed by closing up a bottom portion of the through-hole 219 for forming a hole with bottom, which is formed in the single faced wiring board 217, by use of another single faced wiring board 220, and 224 designates a flexible printed wiring board which is obtained by a manufacturing method in this embodiment. Meanwhile, as to the same things as those described in the fifth embodiment, explanations thereof will be omitted by giving identical reference numerals and signs thereto.

Firstly, as shown in FIG. 11A, prepared is the single faced copper-clad lamination plate 217 on which the copper foil 210 is pasted to an upper surface of the insulating layer 202, and as shown in FIG. 11B, etching is applied to the copper foil 210 on an upper surface, to obtain the single faced wiring board 217 on which the conductive layer 203a having a predetermined conductor pattern is formed. Here, generally speaking, as to a conductor pattern of the conductive layer 203a of the single faced wiring board 217, miniaturization is possible as compared to a conductor pattern of a conductive layer of a double faced wiring board. It is because, ordinarily, in forming conductive layers of a double faced wiring board, copper foils, which exist on both surfaces of a double faced copper-clad insulation plate, are processed to be etched at the same time, and therefore, there is need to apply etchant evenly and uniformly from above and below of the double faced copper-clad insulation plate, but in case that the etchant is pressurized to be sprayed from above and below of the double faced copper-clad insulation plate, there is such a problem that the etchant forms a liquid pool on the upper surface after it is sprayed to the upper surface and etching uniformity is not maintained. Therefore, in case of the double faced wiring board, an etching condition becomes unstable, and it is difficult to form a fine conductor pattern. On one hand, in forming a conductor pattern of a single faced wiring board, only spray from a lower side is enough, and therefore, a liquid pool of etchant can not be formed, and optimization of an etching condition is realized, and fit is possible to realize miniaturization of a conductor pattern.

Next, as shown in FIG. 11C, the through-hole 219 for forming a hole with bottom is formed at a land center portion of a conductor pattern of the single faced wiring board 217, by use of the punching metal mold 218 (penetrating and forming process)

Next, as shown in FIG. 11D, prepared is another single faced wiring board 220 in which the conductive layer 204a is formed in an upper surface of the insulating layer 202a and the through-hole 222 is formed in advance, and the single faced wiring board 222 is pasted to a lower surface of the single faced wiring board 217 through the adhesion layer 221, in such a manner that the through-hole 219 for forming a hole with bottom and the through-hole 222 are communicated (pasting process). Meanwhile, the through-hole 222 of another single faced wiring board 220 is formed in advance by a laser process through the use of an excimer laser, a carbon dioxide gas laser etc.

Next, in the same manner as one described in the fifth embodiment, the composite paste filling process and solder melting process are carried out, and the solder 207a is arbitrarily cooled and hardened to form the interlayer connecting portion 206, and thereby, as shown in FIG. 11E, obtained is the flexible printed wiring board 224 in which the conductor layer 203a on a surface layer and the conductive layer 204a on an inner layer are electrically connected by the interlayer connecting portion 206. Meanwhile, in lieu of the metal particles 207b of composite caste, it is possible to use synthetic resin particles, or mixed one of metal particles and synthetic resin particles, and it is possible to obtain the same operations as those described in the fifth embodiment.

The flexible printed wiring board 224 and a manufacturing method thereof in this embodiment are configured as above, and therefore, have operations as follows.

(1) The single faced wiring boards 217, 220, which are capable of realizing miniaturization of conductor patterns of the conductive layers 203, 204, are pasted, and therefore, it is possible to obtain the flexible printed wiring board 224, in which wiring is formed with high density, simply and with smaller man-hours.

What is claimed is:

1. A flexible printed wiring board comprising:
   an insulative base film on which a conductor pattern is formed at least one surface thereof;
   a solder resist portion formed in a region including a component mounting portion of the conductor pattern in a predetermined pattern; and
   a cover lay film having an opening portion at a predetermined portion and and being provided above the conductor pattern,
   wherein the solder resist portion and the component mounting portion are apparent from the opening portion of the cover lay film.

2. The flexible printed wiring board according to claim 1, wherein the predetermined pattern of the solder resist portion is a pattern having at least one opening portion for component mounting which corresponds to the component mounting portion.

3. The Flexible printed wiring board according to claim 1, further comprising a surface treatment portion formed on a surface of the component mounting portion.

4. The flexible printed wiring board according to claim 1, wherein the cover lay film is pasted to a portion which is bent at the time of incorporating at least a flexible printed wiring board in an electronic device.

5. The flexible printed wiring board according to claim 1, further comprising: at least one insulating layer; at least two conductive layers laminated through the insulating layer; at least one through-hole formed in the insulating layer and the conductive layer; and an interlayer connecting portion filled in the through-hole for electrically connecting between the conductive layers.

6. A flexible printed wiring board manufactured by a method comprising:
   a conductor pattern forming process of forming a conductor pattern on at least one surface of an insulative base film;
   a solder resist forming process of then, forming a solder resist portion of a predetermined pattern, in a region including a component mounting portion of the conductor pattern, by a screen printing method; and
   a cover lay film pasting process of then, pasting a cover lay film having an opening portion at a predetermined portion, on the conductor pattern, in such a manner that an external circumference portion of the opening portion overlaps an upper portion of a peripheral portion of the solder portion,
   wherein the solder resist portion and the component mounting portion are apparent from the opening portion of the cover lay film.

7. The flexible printed wiring board manufactured by the method according to claim 6, wherein the flexible printed wiring board further comprises: at least one insulating layer; at least two conductive layers laminated through the insulating layer; at least one through-hole formed in the insulating layer and the conductive layer; and an interlayer connecting portion filled in the through-hole for electrically connecting between the conductive layers.

* * * * *